(12) United States Patent
Venezia et al.

(10) Patent No.: US 8,187,909 B2
(45) Date of Patent: May 29, 2012

(54) BACKSIDE ILLUMINATED IMAGE SENSOR HAVING DEEP LIGHT REFLECTIVE TRENCHES

(75) Inventors: Vincent Venezia, Los Gatos, CA (US); Hsin-Chih Tai, San Jose, CA (US); Duli Mao, Sunnyvale, CA (US); Sohei Manabe, San Jose, CA (US); Howard E. Rhodes, San Martin, CA (US); Wei Dong Qian, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 161 days.

(21) Appl. No.: 12/853,847

(22) Filed: Aug. 10, 2010

(65) Prior Publication Data

US 2010/0323470 A1 Dec. 23, 2010

Related U.S. Application Data

(62) Division of application No. 12/204,743, filed on Sep. 4, 2008, now Pat. No. 7,800,192.

(60) Provisional application No. 61/027,393, filed on Feb. 8, 2008.

(51) Int. Cl.
*H01L 21/00* (2006.01)
(52) U.S. Cl. .................................. 438/72; 257/E21.352
(58) Field of Classification Search ............ 438/71, 438/72, 237; 257/E21.352
See application file for complete search history.

(56) References Cited

U.S. PATENT DOCUMENTS

| 6,066,511 | A  | * | 5/2000 | Fukusyo ........................ 438/60 |
| 7,294,873 | B2 | * | 11/2007 | Suzuki et al. ................. 257/225 |
| 7,315,014 | B2 |   | 1/2008 | Lee et al. |
| 2002/0153478 | A1 |   | 10/2002 | Hsin |
| 2006/0094151 | A1 |   | 5/2006 | Sumi |
| 2007/0045513 | A1 |   | 3/2007 | Lee et al. |
| 2007/0152250 | A1 |   | 7/2007 | Kim |
| 2007/0200148 | A1 |   | 8/2007 | Hirata et al. |
| 2007/0241377 | A1 |   | 10/2007 | Goushcha et al. |
| 2009/0194671 | A1 |   | 8/2009 | Nozaki et al. |

OTHER PUBLICATIONS

Chinese Patent Application No. 200880126436.8, First Office Action mailed Nov. 2, 2011, 10 pages (with English Translation).
PCT/US2008/087287 International Search Report and Written Opinion of the International Searching Authority mailed Feb. 17, 2009, 9 pages.

* cited by examiner

*Primary Examiner* — Chandra Chaudhari
(74) *Attorney, Agent, or Firm* — Blakely Sokoloff Taylor & Zafman LLP

(57) ABSTRACT

An array of pixels is formed using a semiconductor layer having a frontside and a backside through which incident light is received. Each pixel typically includes a photosensitive region formed in the semiconductor layer and a trench formed adjacent to the photosensitive region. The trench causes the incident light to be directed away from the trench and towards the photosensitive region.

22 Claims, 7 Drawing Sheets

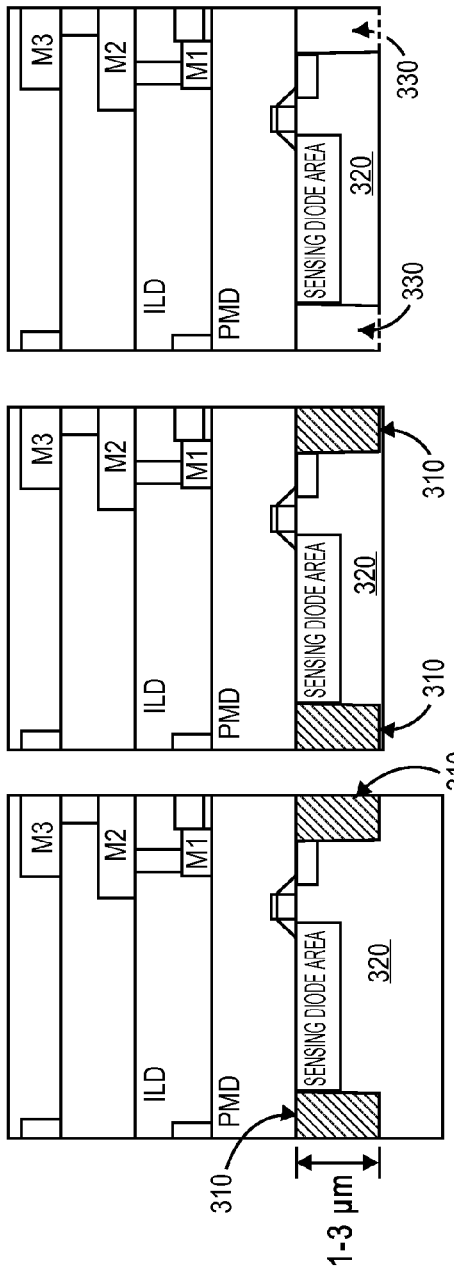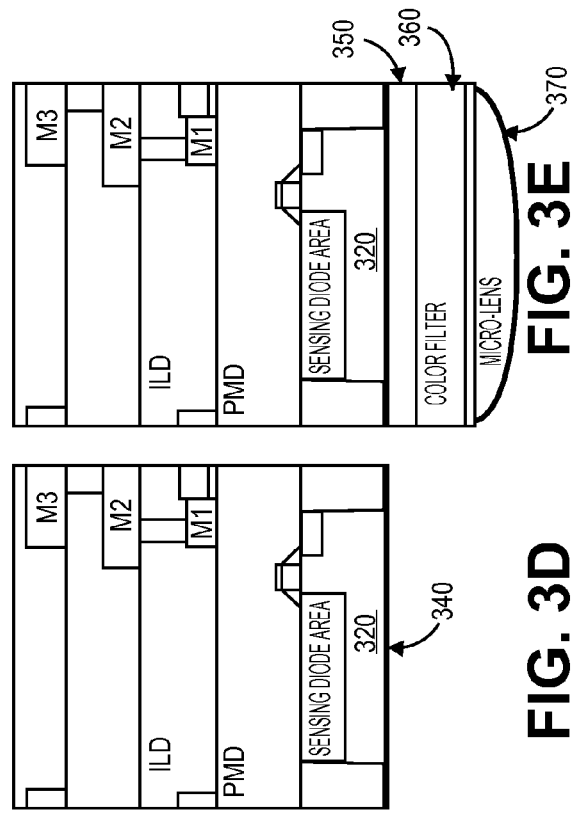

BACKSIDE ILLUMINATED IMAGE SENSOR HAVING DEEP LIGHT REFLECTIVE TRENCHES

CROSS-REFERENCE TO RELATED APPLICATIONS

The present application is a Divisional of U.S. patent application Ser. No. 12/204,743, filed Sep. 4, 2008, which claims the benefit of U.S. Provisional Application No. 61/027,393, filed Feb. 8, 2008, entitled, "Backside Illuminated Image Sensor Having Deep Light Reflective Trenches," hereby incorporated by reference.

TECHNICAL FIELD

This disclosure relates generally to imaging circuits, and more particularly, but not exclusively, relates to image sensors.

BACKGROUND INFORMATION

Integrated circuits have been developed to reduce the size of components used to implement circuitry. For example, integrated circuits have been using ever-smaller design features, which reduces the area used to implement the circuitry, such that design features are now well under the wavelengths of visible light. With the ever-decreasing sizes of image sensors and the individual pixels that are part of a sensing array, it is important to more efficiently capture incident light that illuminates the sensing array. Thus, more efficiently capturing incident light helps to maintain or improve the quality of electronic images captured by the sensing arrays of ever-decreasing sizes.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

FIG. 3 illustrates a sample process for forming a deep light reflective trench.

DETAILED DESCRIPTION

Figure 1:
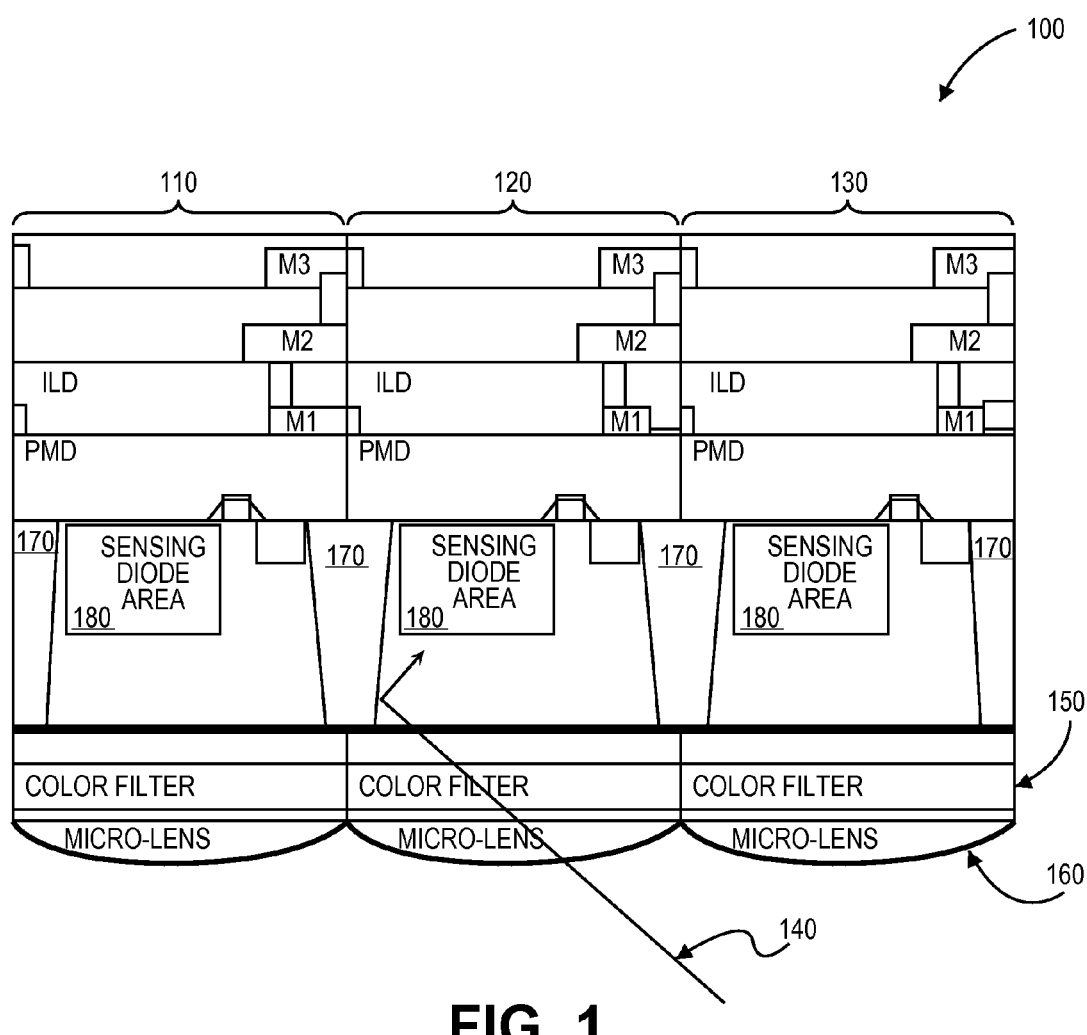
FIG. 1 is an illustration of a cross-section of a sample sensor array of backside illuminated (BSI) pixel in a CMOS image sensor.

Embodiments of an image sensor deep light reflective trench are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals.

Transistors are typically formed in integrated circuits by photolithographic processes that are performed on a silicon substrate. The processes include steps such as applying a photographic resist layer to the substrate, exposing the resist layer to a pattern using light (including deep ultra-violet wavelengths), removing the exposed portions (or non-exposed portions depending on the photo-positive or photo-negative resists that are used) of the resist by etching, and modifying the exposed structure, for example, by depositing or implanting additional materials to form various structure for electronic components (including transistors).

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon of the substrate.

Chemical-mechanical planarization (CMP) can be performed to render the surface of the modified substrate suitable for forming additional structures. The additional structures can be added to the substrate by performing additional processing steps, such as those listed above.

As the size of the image sensors in individual pixels that are part of a sensing array become increasingly smaller, various designs attempt to more efficiently capture the incident light that illuminates the sensing array. For example, the area of the light sensing element (such as a photodiode) of a pixel is typically maximized by arranging a microlens over (or underneath) each pixel so that the incident light is better focused onto the light sensing element. The focusing of the light by the microlens attempts to capture light that would otherwise normally be incident upon of the pixel outside the area occupied by the light sensitive element (and thus lost and/or "leaked" through to other unintended pixels).

Another approach that can be used is to collect light from the "backside" of (e.g., underneath) the CMOS image sensor. Using the backside of the image sensor allows photons to be collected in an area that is relatively unobstructed by the many dielectric and metal layers that are normally used to form a typical image sensor. A backside illuminated (BSI) image sensor can be made by thinning the silicon substrate of the image sensor, which reduces the amount of silicon through which incident light traverses before the sensing region of the image sensor is encountered.

However, when thinning the substrate of the image sensor, a tradeoff between the sensitivity of the pixel and crosstalk (with adjacent pixels) is encountered. For example, when less thinning is used (which results in a thicker remaining silicon substrate), a larger (volumetric) region of a photodiode for conversion of light to electron-hole pairs can be provided. When the electron-hole pairs are formed relatively far away (in the larger provided region) from the photodiode depletion region, the formed electron-hole pairs are more likely to be captured by adjacent photodiodes. The capturing of the formed electron-hole pairs by adjacent photodiodes is a normally undesired effect called electrical cross-talk (which can result in color noise in color image sensors). Accordingly, the probability of electrical cross-talk increases with the thickness of the silicon substrate, while sensitivity decreases as the thinner silicon substrates are used.

Optical crosstalk also affects the efficiency of capturing incident light. Frontside illuminated (FSI) devices typically include metalization layers through which incident light traverses. An FSI device can use appropriately placed metal structures in the metallization layers to guide the light to the photodiode, blocking stray light from entering the wrong photodiode and creating optical crosstalk. In contrast, backside illuminated (BSI) devices do not normally pass incident light through the metalization layers, and thus do not guide light towards a photosensitive region. Optical crosstalk therefore can be a greater problem in a BSI device (as compared with, for example, FSI devices).

In accordance with the present disclosure, an array of BSI pixels is formed using a substrate having a frontside and a backside that is for receiving incident light. Each pixel typically includes metallization layers included on the frontside of the substrate, a photosensitive region formed in the backside (or the frontside) of the substrate. A trench causes the incident light to be directed away from the trench and towards the photosensitive region.

Each BSI pixel has deep trenches that are filled with a low index of refraction material (e.g. $SiO_2$, or wherein the material can be "empty," such as being filled with an atmospheric gas or evacuated to generate a vacuum or partial-vacuum) between adjacent pixels. The deep trenches increase the sensitivity of a pixel while reducing crosstalk between pixels. The electronic crosstalk between pixels is reduced because electron-hole pairs that are formed relatively far below the pixel collection region do not normally (or cannot) migrate to adjacent pixels. The substantially reduced (or eliminated) migration of electron-hole pairs allows for a thicker silicon collection region to be used, which results in increased sensitivity. Optical crosstalk is reduced because the refractive index difference between the substrate (e.g., silicon) and the deep trenches results in a total internal reflection of light having incident angles that, for example, are larger than, for example, 16.6 degrees (where air-filled deep trenches are provided between adjacent pixels).

To illustrate, FIG. 1 shows a cross-section of a sample sensor array of backside illuminated (BSI) pixel in a CMOS image sensor in accordance with an embodiment of the present invention. Array 100 includes pixels 110, 120, and 130. Structure 100 typically contains at least thousands of pixels and often contains more than a million pixels. Three pixels are shown for the purpose of clarity.

The pixels of array 100 are typically arranged in a two-dimensional array such that an electronic image can be formed in response to incident light (140) being captured by each pixel. Each pixel can have a filter 150 (including color filters) such that the electronic image can be used to capture color images or increase the sensitivity of the pixel to certain wavelengths of light, for example. Each pixel can also have a micro-lens 160 associated with each pixel such that the incident light is more directly guided into the pixel.

Figure 2:
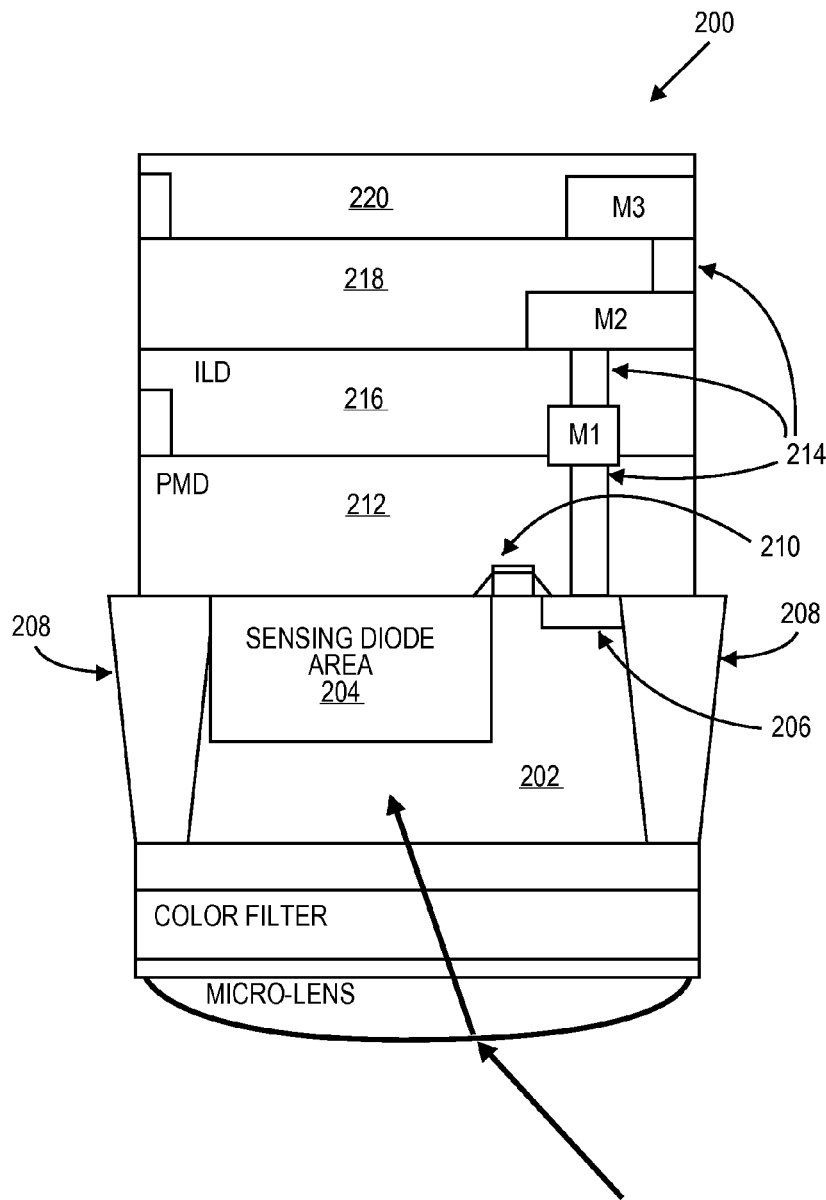
FIG. 2 is an illustration of a cross-section of a sample backside illuminated (BSI) pixel of the CMOS image sensor, according to an embodiment of the invention.
Figure 4C:
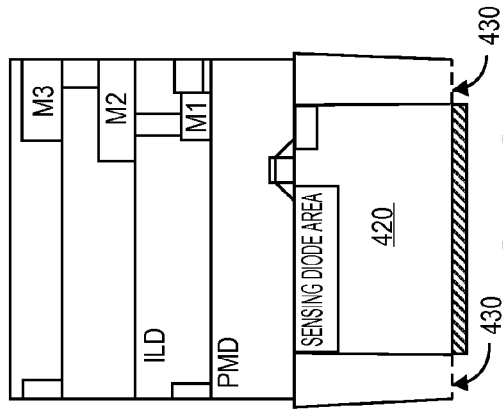
FIG. 4 illustrates an alternative process for forming a deep light reflective trench.
Figure 4B:
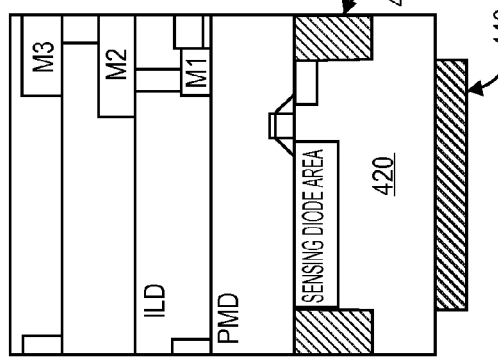
Figure 4E:
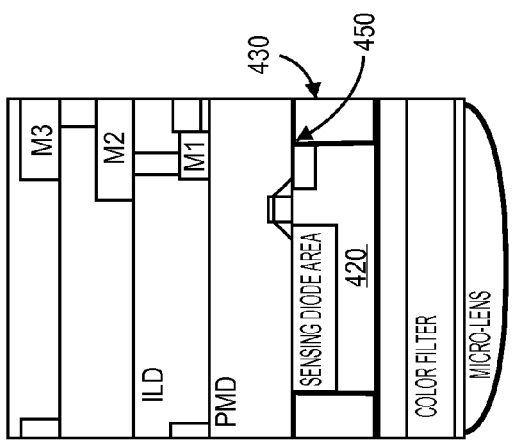
Figure 4A:
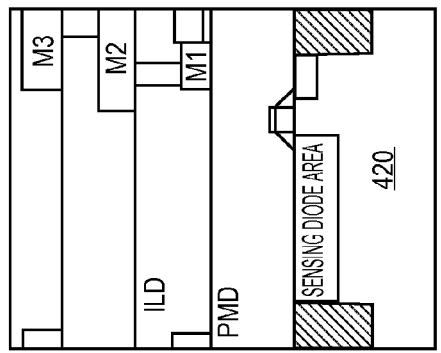
Figure 4D:
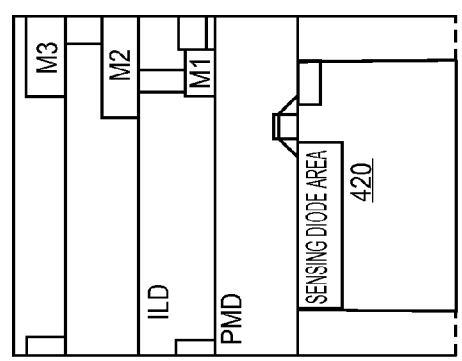

For example, incident light 140 traverses the micro-lens 160 of pixel 120. The incident light is refracted more directly into the substrate of pixel 120 by the micro-lens 160. However, the change in direction of the incident light by the micro-lens 160 is not sufficient (in this example) to prevent the incident light 140 from encountering a trench 170 that lies between pixels 110 and 120. In accordance with the present disclosure, a previous oxide of the trench 170 is removed and/or replaced such that the relative index of refraction of the interface between the trench 170 and the substrate of pixel 120 is increased such that incident light 140 is reflected towards a light sensitive portion 180 of the pixel 120. FIG. 1 is thus used to, for example, illustrate that the light can be bent into the pixel or photodiode by the deep trench FIG. 2 is an illustration of a cross-section of a sample backside illuminated (BSI) pixel of a CMOS image sensor according to an embodiment of the invention. Structure 200 includes a substrate 202 upon which a sensing diode area 204 that is sensitive to light is formed. A floating drain 206 is normally formed having a conductivity type (such as an N-type that has a much higher concentration of N-type material than the conductivity type of the sensing diode area 204).

Insulating structures 208 are formed within the substrate 202 to help isolate the pixels from each other. Insulating structures 208 can typically be formed using processes such as deep trench isolation (DTI) or local oxidation of silicon (LOCOS). An insulating structure 208 can be formed using an DTI process by etching a trench within the substrate 202 and depositing a dielectric material (such as silicon dioxide) within the trench. The trenches can be etched from either the frontside or backside of the substrate 202. The deposited dielectric material can be planarized using CMP. A gate structure 210 is formed above the substrate 202 to control current flowing from the sensing diode area 204 to the floating drain 206.

A typical individual pixel 200 in an image sensor can include a stack of multiple layers including metal layers, planarization layers, and the like. As shown, the pixel 200 includes a pre-metal dielectric material 212. The dielectric material 212 can be any insulator such as an oxide. For some embodiments, the dielectric material can be a silicon oxide. A via 214 can be formed within the dielectric material 212 by etching and depositing a suitable metal or conductive material.

A first metal layer having M1 conductors can be formed in (or upon) the dielectric material 212. For some embodiments, the first metal layer can be etched into the shape of the M1 metal conductors. The dielectric material 216 can be deposited and/or grown to fill the gaps between the M1 conductors. The dielectric material 212 can insulate the M1 conductors from underlying structures. The M1 conductors can be copper, aluminum, an aluminum copper mixture, or other material suitable (such as tungsten) for carrying a signal.

As shown, the pixel 200 includes a second metal layer having M2 conductors disposed in (or upon) an interlayer dielectric material 216. For some embodiments, the second metal layer can be etched into the shape of the M2 conductors. The dielectric material 218 can be deposited and/or grown to fill the gaps between the M2 conductors. The dielectric material 216 can insulate the M1 metal conductors from the M2 metal conductors. Vias 214 can be used to electrically connect structures on different layers of the array.

The pixel 200 further includes a third metal layer having M3 conductors disposed in (or upon) an interlayer dielectric material 218. For some embodiments, the second metal layer can be etched into the shape of the M3 conductors. A dielectric material 220 can be deposited and/or grown to fill the gaps between the M3 conductors. The dielectric material 218 can insulate the M2 metal conductors from the M3 metal conductors. The dielectric material 220 can be grown and/or deposited to insulate M3 metal conductors and/or planarize the top surface of the array.

FIG. 3 illustrates a sample process for forming a deep light reflective trench. Deep light reflective trenches can be formed in an area used for shallow trench isolation. Shallow trench isolation is formed to electrically isolate adjacent pixels and periphery circuit devices. The shallow trench isolation is typically a trench etched within a silicon substrate and subsequently filled with silicon dioxide. A typical trench depth is around 300 to 400 nm deep (depending on the technology used to form the trench), or may be less than 400 nm.

FIG. 3A illustrates a sample cross-section that includes deep trench light reflecting structures 310 (deep trench structures 310) of around one to three microns deep. The deep trench structures 310 are also typically filled with an oxide. After formation of the deep trench structures 310, a frontside fabrication process can be applied. In FIG. 3B after completion of the frontside fabrication process a backside thinning is accomplished to begin a backside illumination (BSI) fabrication process. In a conventional BSI process, the backside of substrate 320 is typically thinned by CMP and/or chemical etching that does not involve the use of an etch stop layer. In accordance with the present disclosure, deep trench structure 310 can be used as a CMP etch stop layer, which allows for improved thickness control over backside thinning.

After the substrate 320 has been thinned, the lower surfaces of the deep trench structures 310 are exposed, as illustrated in FIG. 3B. In FIG. 3C, the exposed silicon dioxide in the deep trenches is removed using an etching process that is selective to silicon (such as a wet or dry etch process). At this point, deep light reflective trenches are formed in empty trenches 330, which creates a large index of refraction difference (such as silicon to air). Alternatively, the empty trenches 330 can be coated (and/or filled) with a metal to make a more perfect reflector. FIG. 3D illustrates a deposition of a non-conformal coating 340 upon the lower surface of the array. A non-conformal dielectric film is deposited, which seals the trenches (which can be empty, coated, or filled). The $SiO_2$ can also be left in the trenches.

FIG. 3E illustrates additional backside processing such as silicon backside protection (such as implants) or flash gates (not shown) or anti-reflective coatings 350. Additionally, filters 360 are disposed over the layer defined by the non-conformal coating 340. The filters can be aligned with photosensitive elements such that a filter 360 is aligned with the substrate and diode sensing area of the pixel. A micro-lens 370 can be disposed over the color filter 360 to help refract light rays into the pixel.

FIG. 4 illustrates an alternative process for forming a deep light reflective trench. FIG. 4A illustrates a pixel structure that is similar to the pixel structure of FIG. 3A (where isolation is achieved with STI, not deep trenches). After thinning to a desired thickness, the backside of substrate 420 is lithographically patterned using a photo-resist 440. The backside of substrate 420 can be patterned using standard methods as illustrated in FIG. 4B. In FIG. 4C, the silicon (of substrate 420) and oxide (of STI structure 410) is etched as shown in FIG. 4C. The etching thus forms deep light reflective trench 430. In FIG. 4D, the photo-resist is removed. In FIG. 4E a reflective coating 450 is conformally applied to surfaces of the deep light reflective trenches 430, and filling trenches 430 as shown in FIG. 4E. Additional processing can be continued to add structures such as an anti-reflective layer, a color filter, and a micro-lens. In various embodiments the trench can be etched from different sides. For example, the deep trench can etched from the backside and aligned with the frontside STI. The backside etching can also be accomplished without having the deep trench aligned with and connected to the frontside STI. In yet another alternative embodiment, the frontside STI can be eliminated and all isolation performed from the backside.

Figure 5:
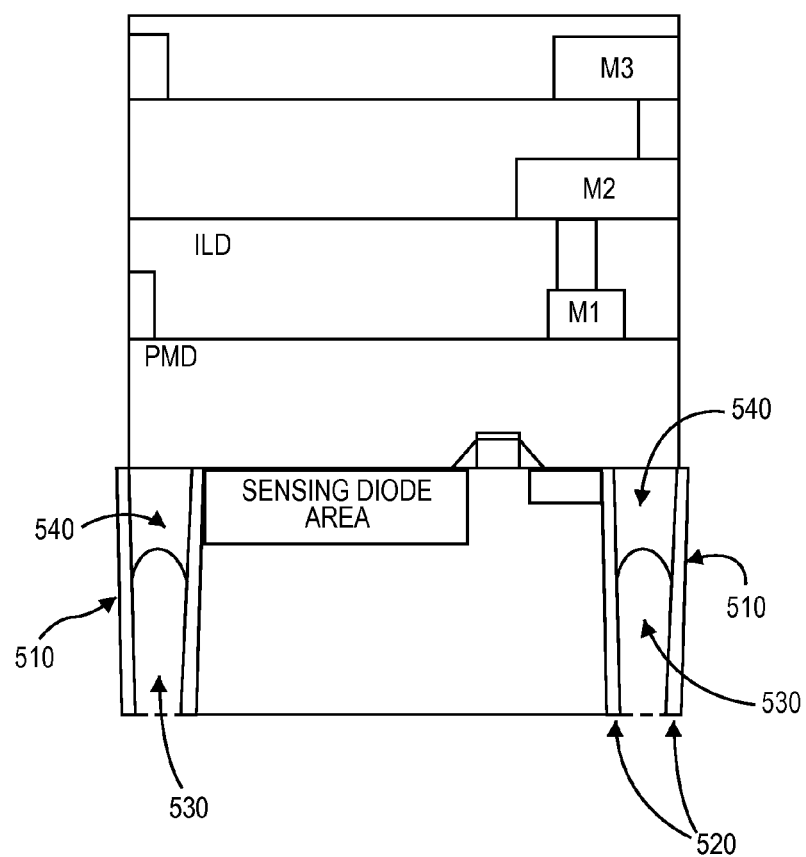
FIG. 5 illustrates a deep light reflective trench having a thin liner oxide.

FIG. 5 illustrates a deep light reflective trench having a thin liner oxide. The standard shallow trench isolation can be formed in both pixel array and in periphery circuits. After the shallow trench etch, the periphery circuit can be masked with photo-resist, and the pixel array trench etched more deeply to one to three microns (to form a deep light reflective trench 510 as illustrated in FIG. 5). A thin liner oxide 520 is grown within deep light reflective trench 510 using a high temperature to passivate the silicon sidewall of the deep light reflective trench 510. The shallow trench in the periphery can be filled with a typical trench fill technique (using, for example, oxide 540). Because of the relatively high aspect ratio of the trench, the deep trench is not necessarily filled completely when the STI is filled. An air gap 530 can thus be formed naturally in the inside portion of the trench. Accordingly, no oxide etching is required after silicon thinning. Not performing the oxide etching has the benefit of keeping the liner oxide for better surface passivation and reduces process complexity. Further passivation can be accomplished by plasma immersed ion implementation after silicon thinning.

Figure 6:
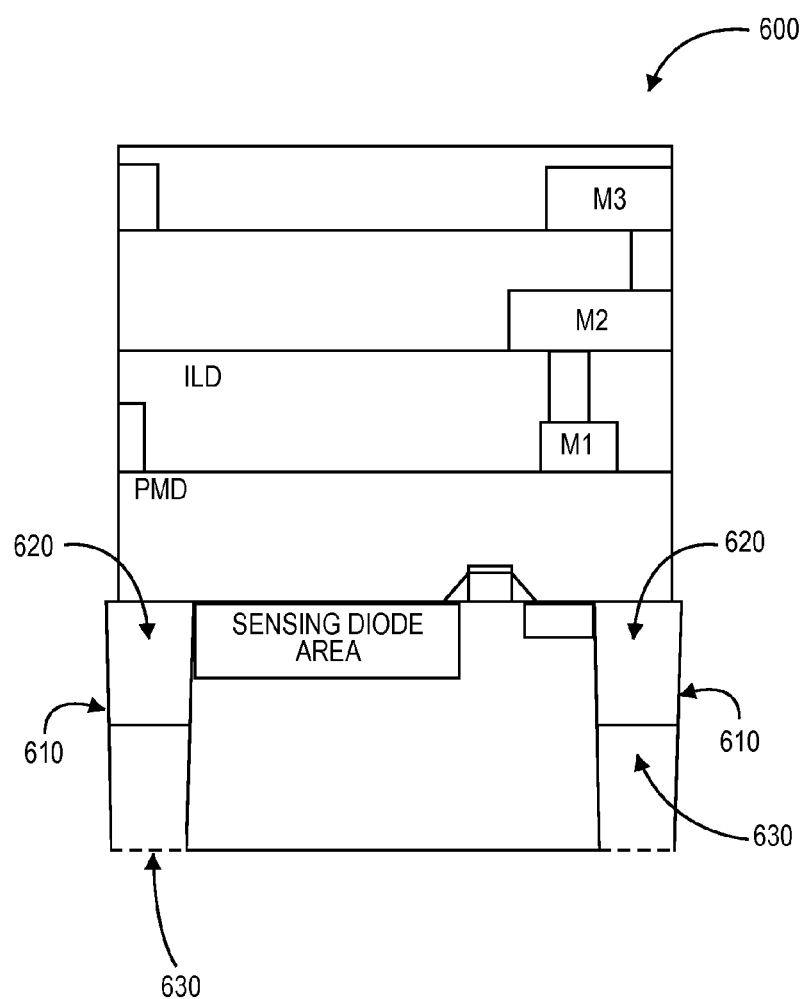
FIG. 6 illustrates a deep light reflective trench having an oxide filler.

FIG. 6 illustrates a deep light reflective trench having an oxide filler. The backside of the pixel 600 can be patterned and deep trench structure 610 etched. A trench fill technique (suitable for filling high aspect ratio trenches, e.g., "tall and thin" trenches) can be used to fill the trenches with oxide to form a deep light reflective trench having an oxide filler. In various sample processes, original oxide 620 may be present. Because of the difference in index of refraction between silicon and silicon dioxide is relatively large, the resulting critical angle for total internal reflection is still sufficient for many sensor applications.

Figure 7:
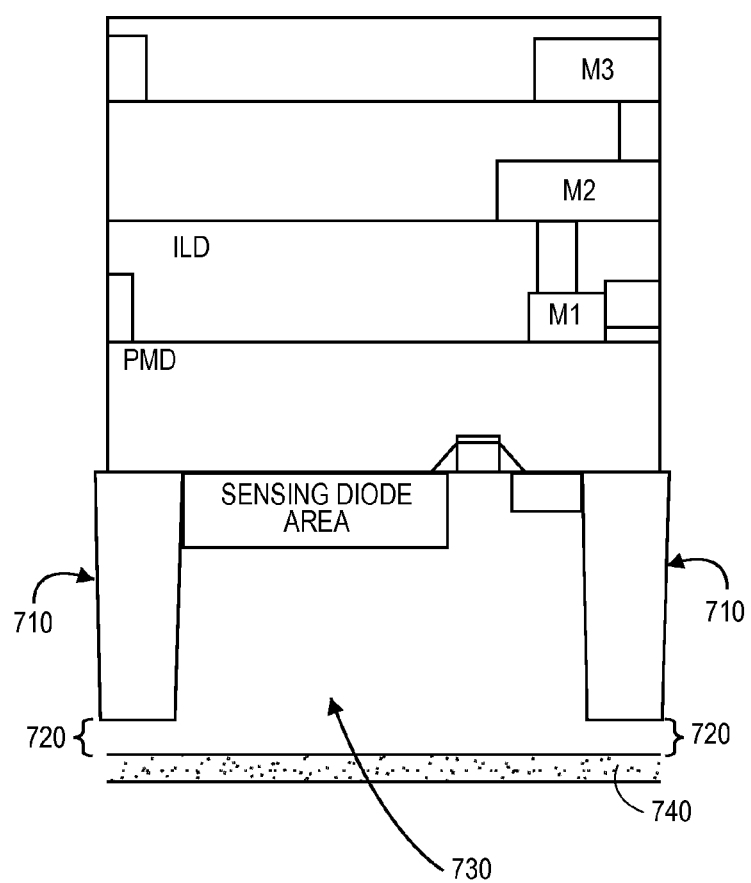
FIG. 7 illustrates a deep light reflective trench that does not extend from the front surface to the back surface.

FIG. 7 illustrates a deep light reflective trench that does not extend from the front surface to the back surface. After the silicon 730 is thinned to the desired thickness, the back surface can be implanted with P-type implant 740 for passivation. A deep trench isolation formed in both pixel array and in periphery circuits can be etched such that a relatively thin layer 720 (such as a fraction of a micron) of silicon remains between the bottom of the deep trench 710 and the back surface. The thin silicon layer 720 remaining underneath the trench can also be used to electrically connect pixels substrate and array transistors.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating an image sensor pixel that is sensitive to light incident through a first side of a semiconductor layer, the method comprising:
   forming a photosensitive region adjacent to a trench within the semiconductor layer, wherein the trench is formed at least through a level in which the photosensitive region is formed and extends past the photosensitive region towards the first side of the semiconductor layer;
   thinning the semiconductor layer from the first side such that a surface of the trench is exposed;
   removing at least a portion of the exposed trench; and
   filling at least a portion of a region previously occupied by the removed portion of the exposed trench with a material such that light incident through the first side of the semiconductor layer is directed away from the trench towards the photosensitive region.

2. The method of claim 1, wherein the surface of the trench is used as an etch stop layer when thinning the semiconductor layer from the first side.

3. The method of claim 1, wherein the material comprises a gas or a partial-vacuum.

4. The method of claim 1, wherein the material comprises a reflective material.

5. The method of claim 4, wherein the material comprises metal.

6. The method of claim 1, wherein the material has an index of refraction less than the semiconductor layer.

7. The method of claim 6, wherein the material comprises silicon dioxide.

8. The method of claim 1, further comprising:
   lining at least one surface exposed by the removing with an oxide prior to the filling.

9. The method of claim 1, further comprising:
   evacuating the removed portion of the exposed trench to form a vacuum or a partial-vacuum.

10. The method of claim 1, further comprising:
    forming metallization layers over a front side of the semiconductor layer, wherein the first side comprises a backside.

11. The method of claim 10, wherein the trench is formed from the front side of the semiconductor layer.

12. The method of claim 1, further comprising applying a non-conformal layer to coat the first side of the semiconductor layer.

13. A method of fabricating an image sensor pixel that is sensitive to light incident through a backside of a semiconductor layer, the method comprising:
    forming a photosensitive region adjacent to a trench within the semiconductor layer, wherein the photosensitive region and the trench are formed from a frontside of the semiconductor layer;
    etching a portion of the backside of the semiconductor layer such that a surface of the trench is exposed; and
    filling a region previously occupied by the etched portion of the backside of the semiconductor layer with a material to extend a depth of the trench within the semiconductor layer, wherein the material causes the light incident through the backside of the semiconductor layer to be directed away from the trench towards the photosensitive region.

14. The method of claim 13, further comprising:
    etching a portion of the trench from the backside; and
    filling the etched portion of the trench with the material.

15. The method of claim 13, wherein after filling the region previously occupied by the etched portion of the backside of the semiconductor layer with the material to extend the depth of the trench, the trench extends to the backside of the semiconductor layer.

16. The method of claim 13, wherein the material comprises a gas or a partial-vacuum.

17. The method of claim 13, wherein the material comprises a reflective material.

18. The method of claim 17, wherein the material comprises metal.

19. The method of claim 13, wherein the material has an index of refraction less than the semiconductor layer.

20. The method of claim 19, wherein the material comprises silicon dioxide.

21. The method of claim 13, wherein the material comprises a liner applied to surfaces exposed by the etching.

22. The method of claim 13, further comprising ion-implanting the backside of the semiconductor layer.

* * * * *